United States Patent
Shin et al.

(10) Patent No.: US 8,603,608 B2
(45) Date of Patent: Dec. 10, 2013

(54) GRAPHENE LAMINATE AND METHOD OF PREPARING THE SAME

(75) Inventors: Hyeon-jin Shin, Suwon-si (KR);
Jae-young Choi, Suwon-si (KR);
Gang-hee Han, Suwon-si (KR);
Young-hee Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 393 days.

(21) Appl. No.: 12/945,236

(22) Filed: Nov. 12, 2010

(65) Prior Publication Data

US 2011/0123776 A1    May 26, 2011

(30) Foreign Application Priority Data

Nov. 13, 2009    (KR) .................. 10-2009-0109796

(51) Int. Cl.
*B32B 9/00*    (2006.01)
*B32B 19/00*    (2006.01)

(52) U.S. Cl.
USPC .......................... 428/172; 428/408; 428/688

(58) Field of Classification Search
USPC ........ 428/156, 172, 408, 423.7, 688; 977/734
See application file for complete search history.

(56) References Cited

U.S. PATENT DOCUMENTS

2005/0127334 A1*    6/2005    Shibata et al. ............... 252/502
2008/0149900 A1    6/2008    Jang et al.

FOREIGN PATENT DOCUMENTS

JP    2003-1888323 A    7/2003
KR    1020090017454 A    2/2009

OTHER PUBLICATIONS

Cortright, R.D. et al., Hydrogen from catalytic reforming of biomass-derived hydrocarbons in liquid water, Nature, vol. 418, pp. 964-967 (Aug. 29, 2002).
Patel, P., How to Make Graphene: A simple way to deposit thin films of carbon could lead to cheaper solar cells, Published by MIT in Technology Review (Apr. 14, 2008).
Ham Bong-Kyoon, "The Challenge of expanding Solar photovoltaic EVA backsheet market", Energy and Business News Paper, Aug. 19, 2009, available at http:// ekn.kr/news/ articlePrint.html?idxno=60398.

* cited by examiner

*Primary Examiner* — Catherine A Simone
(74) *Attorney, Agent, or Firm* — Cantor Colburn LLP

(57) ABSTRACT

A graphene laminate including a substrate, a binder layer on the substrate, and graphene on the binder layer, wherein the graphene is bound to the substrate by the binder layer.

18 Claims, 3 Drawing Sheets

GRAPHENE LAMINATE AND METHOD OF PREPARING THE SAME

CROSS-REFERENCE TO RELATED APPLICATIONS

This application claims priority to Korean Patent Application No. 10-2009-0109796, filed on Nov. 13, 2009, and all the benefits accruing therefrom under 35 U.S.C. §119, the content of which in its entirety is herein incorporated by reference.

BACKGROUND

1. Field

The present disclosure relates to a graphene laminate and a method of preparing the same, and more particularly, to a graphene laminate in which graphene is strongly bound to a substrate, and a method of preparing the graphene laminate by which defects, which may be caused by a transfer process, are minimized.

2. Description of the Related Art

Generally, graphite is an allotropic form of the element carbon having a structure in which two-dimensional ("2D") graphene sheets are stacked. There are two allotropic forms with different stacking arrangements, hexagonal and rhombohedral. The carbon atoms of the graphene sheets are connected to each other in an extended array of hexagonal rings. Recently, one or more graphene sheets were removed from graphite to study the characteristics of a single graphene sheet, and it was observed that graphene sheets provide very useful characteristics as compared to existing materials.

The electrical characteristics of a graphene sheet are dependent upon a crystallographic orientation of the graphene sheet. Accordingly, the electrical characteristics of a graphene sheet may be selected, and a device can be easily designed to use the selected electrical characteristics. Thus, a graphene sheet may be effectively used in a carbon-based electrical device or a carbon-based electromagnetic device. However, for application in a practical device, there remains a need for improved laminates including graphene, and methods of manufacture thereof.

SUMMARY

Provided is a large-sized graphene laminate with fewer defects.

Provided is a method of preparing the graphene laminate.

Provided is a transparent electrode including the graphene laminate.

Provided is an electrical device including the graphene laminate.

Additional aspects, features, and advantages will be set forth in part in the description which follows and, in part, will be apparent from the description.

According to an aspect, a graphene laminate includes: a substrate, a binder layer on the substrate, and graphene on the binder layer, wherein the graphene is bound to the substrate by the binder layer.

The binder layer may be a cured resin layer formed from at least one of a room-temperature curable resin, a thermally curable resin, a hot-melt resin, or a low-pressure curable resin.

The room-temperature curable resin may include at least one of a cellulose ether, a glue, a vinylacetate, a nitrocellulose, a urethane, a synthetic rubber, a cyanoacrylate, or a polyester acrylate.

The thermally curable resin may include at least one of an epoxy, a melamine, a silicone, a phenol, or a resorcinol.

The hot-melt resin may include at least one of a polyethylene, a vinylacetate copolymer, or a thermoplastic.

The thermoplastic may include at least one of a polyurethane, a polyvinylchloride, a polystyrene, a polyamide, a polyethylene, a polyacetal, a nylon, or an acrylic.

The binder layer may have a thickness of about 0.01 nanometers to about 1,000 nanometers.

The substrate may include at least one of a silicon (Si) substrate, a glass substrate, a GaN substrate, a silica substrate, a polyethyeleneterepthalate (PET) substrate, a polyethylene napthalate (PEN) substrate, a polyether sulphone (PES) substrate, a nickel (Ni) substrate, a cobalt (Co) substrate, a iron (Fe) substrate, a platinum (Pt) substrate, a palladium (Pd) substrate, a gold (Au) substrate, an aluminum (Al) substrate, a chromium (Cr) substrate, a copper (Cu) substrate, a manganese (Mn) substrate, a molybdenum (Mo) substrate, a rhodium (Rh) substrate, a iridium (Ir) substrate, a tantalum (Ta) substrate, a titanium (Ti) substrate, a tungsten (W) substrate, a uranium (U) substrate, a vanadium (V) substrate, or a zirconium (Zr) substrate.

The substrate may be a flexible substrate. The substrate may include a material having a Young's modulus of about 0.01 gigaPascals to about 100 gigaPascals.

The graphene may have an area of 1 square millimeter ($mm^2$) or greater.

The graphene may include about ten or less wrinkles per 1000 square micrometers area.

The graphene may cover an area of 99% or greater per 1 $mm^2$ area.

According to other aspect, a transparent electrode and an electrical device may each include the graphene laminate described above.

According to another aspect, a method of preparing a graphene laminate includes: forming graphene on a graphitization catalyst film; coating a surface of a substrate with a binder layer composition; contacting the binder layer composition and the graphene; curing the binder layer composition to form a binder layer; and removing the graphitization catalyst film to prepare the graphene laminate.

The binder layer composition may include at least one of a room-temperature curable resin, a thermally curable resin, a hot-melt resin, or a low-pressure curable resin.

Also disclosed is a graphene laminate including: a substrate including polyethylene terephthalate; a binder layer including ethylene vinyl acetate directly on the substrate; and graphene directly on the binder layer, wherein the graphene is bound to the poylethylene terephthalate by the binder layer, and the graphene includes 10 or less wrinkles per square millimeter of the graphene.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
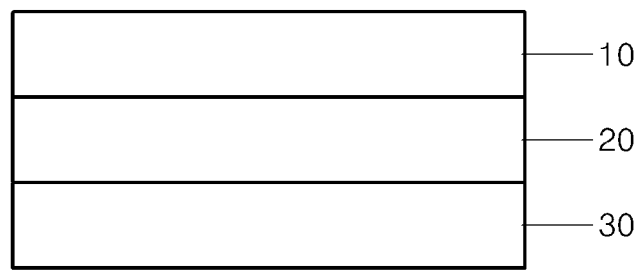
FIG. 1 is a schematic view illustrating an embodiment of a structure of a graphene laminate.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain saturated aliphatic hydrocarbon having the specified number of carbon atoms, specifically 1 to 12 carbon atoms, more specifically 1 to 6 carbon atoms. Alkyl groups include, for example, groups having from 1 to 50 carbon atoms (C1 to C50 alkyl). "Alkenyl" means a straight or branched chain hydrocarbon that comprises at least one carbon-carbon double bond. "Alkynyl" means a straight or branched chain hydrocarbon that has one or more unsaturated carbon-carbon bonds, at least one of which is a triple bond. "Alkoxy" means an alkyl moiety that is linked via an oxygen (i.e., —O-alkyl). Nonlimiting examples of C1 to C30 alkoxy groups include methoxy groups, ethoxy groups, propoxy groups, isobutyloxy groups, sec-butyloxy groups, pentyloxy groups, iso-amyloxy groups, and hexyloxy groups. "Aryl," means a cyclic moiety in which all ring members are carbon and at least one ring is aromatic, the moiety having the specified number of carbon atoms, specifically 6 to 24 carbon atoms, more specifically 6 to 12 carbon atoms. More than one ring may be present, and any additional rings may be independently aromatic, saturated or partially unsaturated, and may be fused, pendant, spirocyclic or a combination thereof. As used herein, the prefix "hetero" means a group or compound including at least one ring member that is a heteroatom (e.g., 1 to 4 heteroatoms) each independently N, O, S, Si, or P.

According to an exemplary embodiment, a graphene laminate includes a substrate 10, a binder layer 20 on the substrate, and graphene 30 on the binder layer 20, as illustrated in FIG. 1.

The term "graphene" as used herein refers to a polycyclic aromatic molecule comprising a plurality of carbon atoms which are connected to each other by covalent bonds. The plurality of carbon atoms may form a six-membered ring as a standard repeating unit, and may further include a 5-membered ring and/or a 7-membered ring. Thus, the graphene appears as a single layer of covalently bonded carbon atoms having generally $sp^2$ hybridization. The graphene may comprise a single layer of graphene. Alternatively, the graphene may comprise multiple layers of graphene stacked upon one another. In this regard, the graphene may have a maximum thickness of about 100 nanometers (nm).

According to an embodiment, the graphene laminate may include about 1 to about 300 layers of graphene, for example, specifically about 1 to about 100 layers of graphene, more specifically about 1 to about 10 layers of graphene. If the number of layers of graphene is within this range, the desirable electrical characteristics of the graphene may be maintained in the graphene laminate.

Transferring the graphene 30 to a separate substrate (i.e., substrate 10) using a binder provides the graphene 30 on the substrate 10 with a reduced number of defects in the graphene. This may be confirmed by determining the number of wrinkles per unit area of the graphene laminate. A wrinkle may occur if the distribution of graphene is not uniform in a particular region, wherein a wrinkle may result from a process of separating and transferring the graphene, or may result from a graphene growing process. A wrinkle is more likely to occur in a large graphene sheet. Also, the fewer the number of wrinkles, the more homogeneous the graphene sheet is, and the better the electrical characteristics of the graphene sheet.

The graphene of the graphene laminate may have about 10 or less wrinkles, specifically 0 to about 9 winkles, more specifically about 5 or less to about 3 or less wrinkles, per 1000 square micrometers ($\mu m^2$) area of the graphene. The graphene may have an area of 1 millimeter ($mm^2$) or greater. For example, the graphene may have an area of about 1 $mm^2$ to about 100 square meters ($m^2$), specifically an area of about 1 $mm^2$ to about 25 $m^2$. The graphene may be present in an area of 99% or greater, specifically in an area of about 99% to about 99.999%, more specifically in an area of about 99.9% to about 99.99%, per 1 $mm^2$ area of the graphene. If the graphene is present in this range, the graphene may be suitably homogeneous, and thus may have uniform electrical characteristics.

The graphene 30 is bound to the substrate 10 via the binder layer 20. Examples of the substrate 10 include an organic substrate, an inorganic substrate, or a metallic substrate. A combination comprising at least one of the foregoing can be used. Examples of the inorganic substrate include a silicon (Si) substrate, a glass substrate, a GaN substrate, a silica substrate, or the like. A combination comprising at least one of the foregoing can be used. Examples of the organic substrate include a polyethyelenetereptthalate ("PET") substrate, a polyethylene napthalate ("PEN") substrate, a polyether sulphone ("PES") substrate, or the like. A combination comprising at least one of the foregoing can be used. Examples of the metal substrate include a nickel (Ni) substrate, a cobalt (Co) substrate, an iron (Fe) substrate, a platinum (Pt) substrate, a palladium (Pd) substrate, a gold (Au) substrate, an aluminum (Al) substrate, a chromium (Cr) substrate, a copper (Cu) substrate, a manganese (Mn) substrate, a molybdenum (Mo) substrate, a rhodium (Rh) substrate, an iridium (Ir) substrate, a tantalum (Ta) substrate, a titanium (Ti) substrate, a tungsten (W) substrate, a uranium (U) substrate, a vanadium (V) substrate, or a zirconium (Zr) substrate. A combination comprising at least one of the foregoing can be used.

The substrate 10 may be bendable or flexible. The substrate 10 may have a Young's modulus of about 0.01 gigaPascals (gPa) to about 100 gPa, specifically about 0.05 gPa to about 5 gPa, more specifically about 0.1 gPa to about 1 gPa. In addition, a high-transparency substrate may be used in a transparent electrode. Thus the substrate 10 may have a transparency of about 10% to about 99.9%, specifically about 20% to about 90%, more specifically about 30% to about 80%.

The substrate 10 may have a thickness of about 1 $\mu m$ to about 5,000 $\mu m$, specifically about 50 $\mu m$ to about 1,000 $\mu m$, more specifically about 100 $\mu m$ to about 500 $\mu m$.

The binder layer 20 that binds the graphene 30 to the substrate 10 may be formed by curing a binder layer composition comprising any of various adhesive resins. Examples of an appropriate adhesive resin include a room-temperature curable resin, a thermally curable resin, a hot-melt resin, or a low-pressure curable resin.

A room-temperature curable resin is a resin which is curable at room temperature. Examples of the room-temperature curable resin include a solvent-dry curable resin that may be cured by evaporating a solvent such as water or an organic solvent; a moisture-curable resin that may be cured by contacting with moisture; or an anaerobically curable resin that may be cured in a vacuum. A combination comprising at least one of the foregoing may be used. Examples of the solvent-dry curable resin include an aqueous solvent-based resin or an organic solvent-based resin. The aqueous solvent-based resin may comprise a cellulose ether, a glue, or a vinylacetate, or a combination comprising at least one of the foregoing. The organic solvent-based resin may comprise a nitrocellulose, or a synthetic rubber, or a combination comprising at least one of the foregoing. Examples of the moisture-curable resin include a cyanoacrylate or a silicone. Examples of the anaerobically curable resin include a polyesteracrylate. Also, any suitable resin may be used, including a combination comprising at least one of the foregoing.

Thermally curable resins are curable by heat. Examples of the thermally curable resin include an epoxy, a melamine, a silicone, a phenol, or a resorcinol. Also, any suitable resin may be used, including a combination comprising at least one of the foregoing.

A hot-melt resin is a type of adhesive that may be applied in a liquid (e.g., melted) state and which forms a solid adhesive film when cooled. A hot-melt resin is may be a solid at room temperature, and thus may be convenient to handle at room temperature. A hot-melt resin does not require a separate drying process, and may be rapidly set and attached to a target. Examples of the hot-melt resin include a polyethylene, a vinylacetate copolymer, a thermoplastic resin, or an ethylene vinyl acetate ("EVA") copolymer, or a mixture thereof. Also, any suitable hot-melt resin may be used, including a combination comprising at least one of the foregoing. The hot-melt resin may include a thermoplastic resin, such as a polyvinylchloride, a polyurethane, a polystyrene, a polyamide, a polyethylene, a polyacetal, a nylon, or an acrylic. However, any suitable hot-melt resin may be used, including a combination comprising at least one of the foregoing. An example of the vinylacetate copolymer includes ethylene-vinylacetate.

The ethylene-vinylacetate, which is a type of hot-melt resin, may be obtained by compounding a tackifier or a wax with a base resin. In this regard, a mixing ratio of ethylene vinyl alcohol and vinylacetate may be appropriately varied to provide various physical properties.

An epoxy, which is further disclosed above as a type of thermally curable resin, may be included in an adhesive containing the epoxy as a major component. The epoxy may cure as bisphenol A and epichlorohydrin react together by condensation to produce an epoxy resin prepolymer, which is then graft-polymerized by a curing agent added thereto. These materials may cure gradually over time and may further bond to the target.

A polyvinylchloride, which is further disclosed above as a type of thermoplastic resin, may be included in a gel resin which includes a solution comprising a monomer or a copolymer of the monomer and the vinylacetate.

A silicone, which is further disclosed above as a type of thermally curable resin, may be included in an adhesive containing an organopolysiloxane as a major compound. The silicone may be classified as either a condensation-curable type silicone or an addition-curable type silicone. The condensation-curable type silicone may be in liquid or paste form and may comprise a mixture of an organopolysiloxane having a hydroxyl terminal group and a cross-linking agent. After being disposed (e.g., coated), a condensation-curable type silicone begins to cure from a surface of the coating due to a reaction with moisture in the air, and forms a cured layer with rubber-like elasticity. Modified silicone materials include an adhesive containing polypropyleneoxide having a methyldimethoxysilyl terminal group as a major component. The silicone may cure relatively rapidly and attach to a target when alkoxysilyl groups are hydrolyzed by moisture in the air to induce a condensation reaction.

The above-listed various types of resins may be used individually or in a combination comprising at least one of the foregoing to form the binder layer 20.

The amount of a curable resin used to form the binder layer may be sufficient to bind the substrate and the graphene. The amount of curable resin determines the thickness of the binder layer. The thickness of the binder layer may be varied according to the adhesive force of the curable resin, the type and thickness of the substrate, and the like. The binder layer may have a thickness of about 0.1 μm to about 1,000 μm, specifically about 1 μm to about 500 μm, more specifically about 10 μm to about 100 μm. However, the binder layer may have any appropriate thickness.

The graphene laminate disclosed above may be prepared as follows.

Initially, graphene is grown on a graphitization catalyst film 40. Also, the binder layer composition is disposed (e.g., coated) on a surface of a substrate 10 to obtain an adhesive substrate for binding. The substrate 10 may be a flexible substrate, and may comprise PET, for example. Then, the adhesive substrate, which is coated with the binder layer composition, and the graphitization catalyst film, which comprises the graphene on the graphitization catalyst, are disposed in such a way as to contact the binder layer composition and the graphene. Next, the binder layer composition is cured to form the binder layer, and the graphitization catalyst film is removed, thereby preparing the graphene laminate.

Each of the steps involved in the preparation of the graphene laminate will be further disclosed below in additional detail.

Graphene Formation—Vapor-Phase Method

Graphene may be formed on a graphitization catalyst film using any of a variety of known methods, for example, a vapor-phase method or a liquid-phase method.

For example, a vapor-phase method will now be briefly disclosed. First, a graphitization catalyst film is formed, and the graphitization catalyst film is then heat-treated while disposing a vapor-phase carbon source thereon, thereby forming graphene. Then, the graphene is grown under cooler conditions. Specifically, a vapor-phase carbon source is disposed at a selected pressure into a chamber in which the graphitization catalyst film is present, and then heat-treated at a selected temperature for a selected time, thereby forming graphene in which carbon atoms of the vapor-phase carbon source are bonded to each other to form a hexagonal planar structure (i.e., graphene). Then, the graphene is cooled at a selected cooling rate to form a graphene sheet having a uniform arrangement on the graphitization catalyst film.

In the graphene sheet formation process disclosed above, the vapor-phase carbon source may be any of a variety of materials that supply carbon and are present in a vapor phase at a temperature of 300° C. or higher. The vapor-phase carbon source may be any carbon-containing compound. For example, the vapor-phase carbon source may be a compound including six or less carbon atoms, a compound including four or less carbon atoms, or a compound including two or less carbon atoms. For example, the vapor-phase carbon source may include at least one of carbon monoxide, ethane, ethylene, ethanol, acetylene, propane, propylene, butane, butadiene, pentane, pentene, cyclopentadiene, hexane, cyclohexane, benzene, or toluene. A combination comprising at least one of the foregoing can be used.

The vapor-phase carbon source may be injected into a chamber containing a graphitization catalyst film at a selected pressure. The vapor-phase carbon source may be used alone or in combination with an inert gas, such as helium or argon.

Alternatively, hydrogen may be further used in combination with the vapor-phase carbon source. While not wanting to be bound by theory, it is believed that hydrogen keeps a surface of the metal layer containing the catalyst clean, and thus may control the reaction of the vapor-phase carbon source with the metal layer. Hydrogen may be used in a range of about 5% by volume to about 40% by volume, based on the total volume of the chamber. Specifically, hydrogen may be used in a range of about 10% by volume to about 30% by volume, more specifically, in a range of about 15% by volume to about 25% by volume, based on the total volume of the chamber.

When the vapor-phase carbon source is loaded into the chamber in which the graphitization catalyst film is present and is then heat-treated at a selected temperature, graphene is formed on a surface of the graphitization catalyst film. The heat treatment temperature may play a significant role in forming graphene. The heat treatment temperature may be about 300° C. to about 2000° C., specifically about 500° C. to about 1500° C., more specifically about 700° C. to about 1300° C.

The thermal treatment may be maintained at a predetermined temperature for a predetermined time, and thus generation of the graphene may be controlled. The longer the time period of the thermal treatment, the larger the amount of graphene that may be generated, and the larger the thickness of the graphene may be. Also, the shorter the time period of the thermal treatment, the smaller the thickness of the graphene may be. Thus, in order to obtain a desired thickness of the graphene, the time taken to perform the thermal treatment may be significant, in addition to the type and supply pressure of the vapor-phase carbon source, the type of the graphitization catalyst, and the size of the chamber. For example, the thermal treatment may be maintained for about 0.001 hour to about 1000 hours, specifically about 0.001 hour to 500 hours, more specifically 0.01 hour to 100 hours.

A heat source for the thermal treatment is not limited, and may be an induction heater, a radiant heater, a laser, an infrared ("IR") heater, a microwave heater, a plasma, ultraviolet ("UV") rays, or a surface plasmon heater. Such a heat source may be attached to the chamber to increase the temperature in the chamber to a predetermined temperature.

A selected cooling process is performed on the resulting product obtained after the thermal treatment. The cooling process is performed so that the patterned graphene is grown and arranged uniformly. Because sudden cooling may generate a defect such as a crack in the graphene sheet, the resulting product may be slowly cooled at a constant rate. For example, the resulting product may be cooled at a rate of about 0.1° C. to about 10° C. per minute, specifically 0.5° C. to about 5° C. per minute, more specifically about 1° C. per minute, or may be cooled naturally (e.g., by ambient convection). The natural cooling of the resulting product is performed by simply removing the heat source used for the thermal treatment. By removing only the heat source, a sufficient cooling rate may be obtained.

The graphene, after the cooling process, may have a thickness of about one to about 300 layers. For example, the graphene may have a thickness of about one to about 60 layers, specifically, a thickness of about one to about 15 layers.

The thermal treatment and the cooling process may be performed for one cycle. However, the thermal treatment and the cooling process may be repeated several times to generate high density multi-layered graphene. In an embodiment, the thermal treatment and the cooling process are performed for 2 to 10 cycles, specifically 3 to 8 cycles.

The graphitization catalyst is used in the form of a metal film having a planar structure. The graphitization catalyst contacts the vapor-phase carbon source to cause carbon elements from the vapor-phase carbon source to link together and form a hexagonal planar structure. For example, the graphitization catalyst may be a catalyst used to synthesize graphite, induce carbonization, or synthesize carbon nanotubes. For example, the catalyst may include at least one metal of Ni, Co, Fe, Pt, Au, Al, Cr, Cu, Mg, Mn, Mo, Rh, Si, Ta, Ti, W, U, V, or Zr. A combination comprising at least one of the foregoing can be used.

Graphene obtained by using the vapor-phase method disclosed above has a homogeneous structure without defects. While not wanting to be bound by theory, it is believed that the graphene is without defects because the graphene is produced from pure vapor-phase materials undergoing a high-temperature thermal treatment.

Graphene Formation—Polymer Method

The graphene may also be formed using a polymer. The polymer method may involve contacting a liquid carbonaceous material to the graphitization catalyst film. For example, a carbon-containing polymer may be coated on the substrate having the graphitization catalyst film.

Any carbon-containing polymer may be used as the carbonaceous material. However, if a self-assembled polymer is used, higher density graphene may be obtained. While not wanting to be bound by theory, it is believed that higher density graphene is obtained because the self-assembled polymer may be vertically arranged in a regular pattern on the graphitization catalyst film.

The self-assembled polymer, which forms a self-assembled layer, may be at least one self-assembled polymer of an amphiphilic polymer, a liquid crystal polymer, a conductive polymer, or a combination comprising at least one of the foregoing.

Because the amphiphilic polymer has both hydrophilic and hydrophobic functional groups in a structure thereof, the amphiphilic polymer may be arranged in a uniform arrangement, such as a Langmuir-Blodgett arrangement, a dipping arrangement, or a spin arrangement, in an aqueous solution. The amphiphilic polymer includes a hydrophilic functional group including at least one of an amino group, a hydroxyl group, a carboxyl group, a sulfate group, a sulfonate group, a phosphate group, a salt thereof, or a combination comprising at least one of the foregoing; and a hydrophobic functional group including at least one of a halogen atom, a $C_1$-$C_{30}$ alkyl group, a $C_1$-$C_{30}$ halogenated alkyl group, a $C_2$-$C_{30}$ alkenyl group, a $C_2$-$C_{30}$ halogenated alkenyl group, a $C_2$-$C_{30}$ alkynyl group, a $C_2$-$C_{30}$ halogenated alkynyl group, a $C_1$-$C_{30}$ alkoxy group, a $C_1$-$C_{30}$ halogenated alkoxy group, a $C_1$-$C_{30}$ heteroalkyl group, a $C_1$-$C_{30}$ halogenated heteroalkyl group, a $C_6$-$C_{30}$ aryl group, a $C_6$-$C_{30}$ halogenated aryl group, a $C_7$-$C_{30}$ arylalkyl group, a $C_7$-$C_{30}$ halogenated arylalkyl group, or a combination comprising at least one of the foregoing. Examples of the amphiphilic polymer include a decanoic acid, a lauric acid, a palmitic acid, a stearic acid, a myristoleic acid, a palmitoleic acid, an oleic acid, a stearidonic acid, a linolenic acid, a caprylamine, a laurylamine, a stearylamine, an oleylamine, or a combination comprising at least one of the foregoing.

The liquid crystal polymer may be arranged in a uniform orientation in liquid. The conductive polymer may form a selected crystalline structure by self-assembling in a layer of the polymer while a solvent used to dissolve the conductive polymer vaporizes from the layer. Accordingly, the liquid crystal polymer and the conductive polymer may be arranged by using a method, such as dipping, spin coating, or the like.

Examples of the liquid crystal polymer and the conductive polymer include a polyacetylene, a polypyrrole, a polythiophene, a polyaniline, a polyfluoropolymer, a poly(3-hexylthiophene), a polynaphthalene, a poly(p-phenylene sulfide), a poly(p-phenylene vinylene), or a combination comprising at least one of the foregoing.

The carbon-containing polymer may include at least one polymerizable functional group, such as a carbon-carbon double bond or a carbon-carbon triple bond, in a structure thereof. The at least one polymerizable functional group may enable polymerization between polymers (e.g., cross-linking) through a polymerization process, such polymerization upon ultraviolet light irradiation, after forming a layer thereof. The carbonaceous material obtained therefrom may have a large molecular weight, specifically about 100,000 to about 5,000,000 Daltons, more specifically about 500,000 to about 1,000,000 Daltons, and thus may substantially reduce or effectively prevent carbon from being volatized during thermal treatment.

Such a carbon-containing polymer may be polymerized before or after being coated on the graphitization catalyst film. In an embodiment, when the carbon-containing polymer is polymerized before being coated on the graphitization catalyst film, a polymerization layer obtained through a separate polymerization process may be transferred onto the graphitization catalyst to obtain a carbonaceous material layer. Such a polymerization process and a transfer process may be repeated several times to select the thickness of the graphene (i.e., the graphene sheet).

The carbon-containing polymer may be disposed on the graphitization catalyst film using any suitable method. For example, the carbon-containing polymer may be disposed on a surface of the graphitization catalyst film by using a Langmuir-Blodgett method, a dip coating method, a spin coating method, or a vacuum-deposition method. Through such coating methods, the carbon-containing polymer may be coated on a portion of or on an entire surface of the substrate or the graphitization catalyst film.

In an embodiment, the molecular weight of the carbon-containing polymer, the thickness of a layer, or the number of self-assembled layers of the carbon-containing polymer disposed on the substrate may be selected according to the desired number of graphene layers. In an embodiment, when a carbon-containing polymer having a large molecular weight is used, the amount of carbon is high, and thus the number of graphene layers is also high. The thickness of the graphene layer may be selected according to the molecular weight of the carbon-containing polymer.

An amphiphilic organic material may be a self-assembled organic material and may include both a hydrophilic portion and a hydrophobic portion in its molecular structure. The hydrophilic portion of the amphiphilic organic material, which may be, for example, an amphiphilic polymer, binds to the graphitization catalyst film, which is hydrophilic, and is thus evenly arranged on the graphitization catalyst film. As a result, the hydrophobic portion of the amphiphilic organic material is exposed in a direction away from the substrate, and thus binds to a hydrophobic portion of the amphiphilic organic material, which may be an amphiphilic polymer, which is not bonded to the graphitization catalyst film. When the amount of the amphiphilic organic material is sufficient, the amphiphilic organic material may be sequentially stacked on the graphitization catalyst layer by hydrophilic-hydrophobic bonds. After the amphiphilic organic material forms a plurality of layers, thermal treatment is performed to form a graphene layer. Accordingly, by selecting a suitable amphiphilic organic material, and selecting a thickness of layers of the amphiphilic organic material by varying the amount of the amphiphilic organic material, the number of graphene layers may be selected. Thus, graphene having a desired thickness may be prepared according to its intended use.

Graphene Formation—Liquid-Phase Method

The graphene may also be formed using a liquid-phase method. In the liquid-phase method, the graphitization catalyst film is brought into contact with a liquid carbonaceous material, and is then thermally treated to obtain graphene.

In the process of contacting the graphitization catalyst film and the liquid carbonaceous material, the graphitization catalyst film may be immersed in the liquid carbonaceous material, and then may be pre-heated.

The liquid carbonaceous material may be any carbon-containing organic liquid that may be thermally decomposed by a reaction with the graphitization catalyst film. For example, the liquid carbonaceous material may be a polar organic solvent or a non-polar organic solvent having a boiling point of about 60° C. to about 400° C. Examples of the organic liquid include an alcohol, an ether, a ketone, an ester, or an organic acid. While not wanting to be bound by theory, it is believed that an alcohol or an ether may be desirable because they provide good adsorption to the graphitization metal catalyst, good reactivity, and good reducing power. Examples of the alcohol include monovalent alcohols and polyvalent alcohols, which may be used alone or in combination thereof. Examples of monovalent alcohols include propanol, pentaol, hexanol, heptanol, or octanol, and examples of polyvalent alcohols include propylene glycol, diethylene glycol, dipropylene glycol, triethylene glycol, tripropylene glycol, octylene glycol, tetraethylene glycol, neopentyl glycol, 1,2-butanediol, 1,3-butanediol, 1,4-butanediol, 2,3-butanediol, dimethyl-2,2-butanediol, or dimethyl-2,2-butanediol. A combination comprising at least one of the foregoing can be used. The monovalent alcohol and polyvalent alcohol may further include an ether group, in addition to the hydroxyl group.

When a liquid carbonaceous material is used, the graphitization catalyst film may be carburized by pre-heating. The liquid carbonaceous material may be thermally decomposed during the pre-heating due to a reaction with the graphitization catalyst film. A thermal decomposition process of a liquid hydrocarbon material by a graphitization catalyst is well known (see R. D. Cortright, R. R. Davda and J. A. Dumesic, Hydrogen from catalytic reforming of biomass-derived hydrocarbons in liquid water, Nature, Vol. 418, page 964, the content of which in its entirety is herein incorporated by reference). For example, thermal decomposition products of an organic liquid, such as a polyvalent alcohol, may include an alkane, $H_2$, $CO_2$, and $H_2O$. A carbon component of the thermal decomposition products may permeate into the catalyst.

The pre-heating process for the thermal decomposition may be performed at a temperature of about 100° C. to about 1200° C., specifically about 200° C. to about 1100° C., more specifically about 300° C. to about 1000° C. for about 10 hours to about 24 hours, specifically about 12 hours to about 22 hours, more specifically about 14 hours to about 20 hours.

In addition, when a carburization method is used, the amount of carbon in the catalyst may be controlled by varying the degree of carburization. Thus, the thickness of a graphene layer formed in a subsequent process may also be controlled. For example, if a liquid carbonaceous material that is prone to thermal decomposition is used, a large amount of carbon may be decomposed and permeated into the catalyst layer during the thermal decomposition reaction of the liquid carbonaceous material. In addition, the amount of carbon permeated into the catalyst layer may also be controlled by varying the preheating temperature and duration thereof during the carburization. Thus, the rate of formation of graphene may be controlled. Thus, it may be easier to control the thickness of graphene layers.

As further disclosed above, a carbon-containing polymer or a liquid carbonaceous material is brought into contact with the graphitization catalyst film, and then a thermal treatment is performed thereon, thereby forming graphene on the graphitization catalyst film. The thermal treatment may be performed in the same manner as in the vapor-phase method.

Any of a variety of methods, including the vapor-phase method, the polymer method, and the liquid-phase method, may be used to form the graphene. The graphitization catalyst film used to form the graphene may have a planar structure, and may have a pattern of the metal if needed. The graphitization catalyst film may be treated to have a pattern, for example, like a printed circuit, before formation of the graphene. Then, the graphene may be formed in the form of the pattern.

Preparation of the Adhesive Substrate for Binding

An adhesive substrate with the binder layer may be manufactured by coating a surface of a substrate having a predetermined size with a composition for the binder layer (i.e., a binder layer composition) using a commercially available coating method, such as spin coating, spray coating, dip coating, inkjet coating, or bar coating, for example. The substrate may be any of the substrates disclosed above.

The composition for the binder layer may include any kind of curable resin that has adhesive properties (e.g., provides a binding force) and may form the binder layer by being cured. For example, the composition for the binder layer may include at least one curable resin of a room-temperature curable resin, a thermally curable resin, a hot-melt resin, or a low-pressure curable resin. Examples of these resins are disclosed above.

The composition for the binder layer may form the binder layer when a room-temperature curable resin, a thermally curable resin, a hot-melt resin, or a low-pressure curable resin in the composition is cured. The binder layer may have a thickness of about 5 μm to about 500 μm, specifically a thickness of about 10 μm to about 300 μm, more specifically a thickness of about 20 μm to about 200 μm.

A curing method used to form the binder layer may vary according to the characteristics of a curable resin used therefore. For example, thermal curing, UV curing, hot-melt curing, dry curing, moisture curing, anaerobic curing, pressure curing, or the like may be used.

The composition for the binder layer may further include an additive in addition to the curable resin. For example, a curing aid, a photopolymerization initiator, or a cross-linking agent may be further included. An amount of the additive may be about 1 part by weight to about 20 parts by weight, specifically about 2 parts by weight to about 15 parts by weight, more specifically about 4 parts by weight to about 10 parts by weight, based on 100 parts by weight of the curable resin. The curing aid may include at least one of an imidazole compound, a triphenylphosphine ("TPP"), or a tertiary amine. However, any suitable compound may be used. Examples of the photopolymerization initiator include a benzoin, a benzylketal, a benzophenone, an acetophenone, a thioxanthone, or a phosphineoxide. These materials may be used individually or in combination of at least one of the foregoing, and may be chosen according to the wavelength of exposure equipment, exposure time, and performance of the UV-curable binder layer, for example considering stability of the binder layer over time. The cross-linking agent may include at least one compound selected from among an isocyanate compound, an epoxy compounds, a melamine compound, or an aziridine compound. A combination comprising at least one of the foregoing can be used.

The composition for the binder layer may be a polymerizable composition including a polymerizable monomer. In this regard, the polymerizable monomer may be cross-linked chemically by a condensation or an addition reaction, or may be cross-linked by radiation, for example, by exposure to light or UV light, to form a polymer, resulting in the binder layer. For example, the polymerizable monomer may be at least one selected from among acryloylmorpholine, methyl acrylate, ethyl acrylate, ethylcarbitol acrylate, 1,6-hexanediol acrylate, propyl acrylate, isopropyl acrylate, isobornyl acrylate, butyl acrylate, isobutyl acrylate, tert-butyl acrylate, cyclohexyl acrylate, dipentaerythritol tetraacrylate, or ethoxylated and/or propolylated derivatives thereof; hexyl acrylate, neopentyl acrylate, ethylene glycol acrylate, triethylene glycol acrylate, trimethylolpropane triacrylate, or ethoxylated and/or propolylated derivatives thereof; octyl acrylate, pentaerythritol tetraacrylate, phenoxyethyl acrylate, isooctyl acrylate, isobornyl methacrylate, methyl methacrylate, ethyl methacrylate, neopentyl glycol acrylate, isopropyl methacrylate, butyl methacrylate, isobutyl methacrylate, cyclohexyl methacrylate, ethylene glycol dimethacrylate, triethylene glycol dimethacrylate, hexyl methacrylate, octyl methacrylate, pentaerythritol tetramethacrylate, isooctyl methacrylate, neopentyl glycol methacrylate, styrene, methylstyrene, cyclopentadiene, vinyl acetate, vinyl chloride, or vinylcaprolactam.

Binding

The adhesive substrate manufactured as disclosed above is bound to the graphene formed on the graphitization catalyst film.

Figure 2:
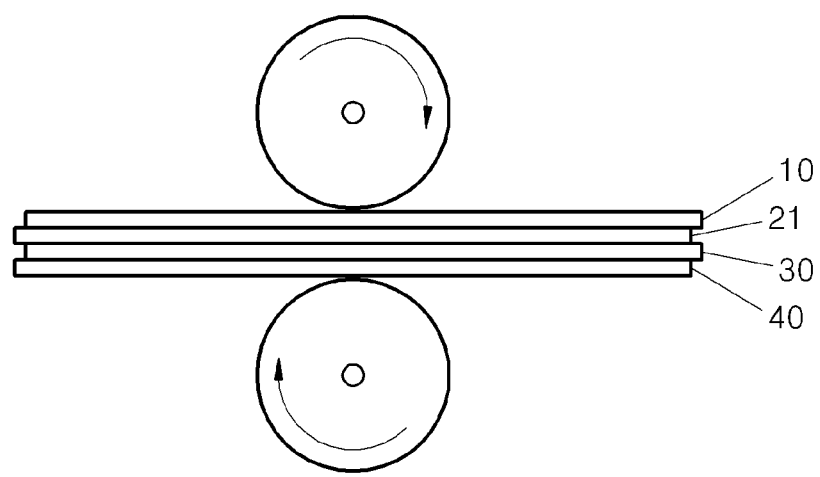
FIG. 2 is a schematic illustration of an embodiment of a process of transferring a graphitization catalyst film and a separate substrate.

For example, as illustrated in FIG. 2, the graphitization catalyst film 40 on which the graphene 30 is formed may be disposed to merely contact the substrate 10, which is coated with the binder layer composition 21. The mere contacting of the graphene 30 and the binder layer composition 21 is sufficient to attach the graphene to the graphitization catalyst film 40 via the binder layer composition.

The binding force between the graphene and the binder layer composition may be strengthened by pressing after they are brought into contact with each other. The pressing may be conducted by using a roller, such as a single roller or dual rollers, for example. For example, a plurality of sets of dual rollers may be used. The binding targets, i.e., the graphitization catalyst film with the graphene and the substrate with the binder layer composition, may be allowed to pass between the dual rollers under pressure during the binding process.

The binding process is followed by curing the binder layer composition to form a binder layer 20 between the graphene 30 and the opposite substrate 10. The cured binder layer more tightly binds the graphene and the substrate than the binder layer composition. Examples of a suitable curing method include pressure curing, solvent-dry curing, moisture (e.g., wet) curing, anaerobic curing, thermal curing, hot-melt curing, and photo-curing.

Pressure curing includes curing a target by applying an appropriate pressure with a pressing roller, such as a single or dual rollers as described above. Solvent-free curing includes curing a target by drying water or an organic solvent from a target. Moisture curing includes curing a target using moisture in the air or moisture adhered to a surface of the target. Anaerobic curing includes curing a target under anaerobic conditions. Photo-curing includes curing a target by UV or e-beam irradiation, and is useful for a target including a polymerizable monomer containing a photopolymerization initiator.

These curing methods may be performed at room temperature, or heat may be used in a thermal curing or a hot-melt curing process. For example, in hot-melt curing, after heat is applied to a target so that the target is flowable and adhesive, the target is cooled to be cured. The cured target may recover adhesiveness when heated again. This recovery distinguishes hot-melt curing from thermal curing.

The method of curing the binder layer composition may vary according to a type of an adhesive used as the binder. An appropriate curing method may be chosen from among the curing methods listed above by one of skill in the art without undue experimentation.

The above-described binding process is performed without separating the graphene from the graphitization catalyst film, and thus may minimize defects on the graphene. In other words, the graphene may be transferred with the graphitization catalyst film thereon to a separate substrate (i.e., substrate 10), and thus a transfer process efficiency may be improved. Even when graphene formed on a large graphitization catalyst film is transferred, the final graphene product may have fewer wrinkles, and generation of charge traps and mobile charges may be suppressed.

In addition, because the binder layer is formed by curing the binder, the binder may be blocked from permeating into the graphene and deteriorating electrical characteristics of the graphene. The binder layer may markedly improve the binding force of the graphene to the substrate, as compared to a simple stack of graphene and substrate without any binder layer, and thus the binder layer may enable fabrication of a more stable structure which may be implemented in an electric device or electrode.

Removing the Graphitization Catalyst Film

When the binding process described above is complete, a laminate of the graphitization catalyst film/graphene/binder layer/substrate is obtained. The graphitization catalyst film may be removed by subsequent acid treatment to obtain a graphene laminate including the graphene and the substrate bound together by the binder layer.

In the acid treatment for removing the graphitization catalyst film, the laminate of the graphitization catalyst film/graphene/binder layer/substrate may be immersed in an acid solution, for example, hydrochloric acid, sulfuric acid, or nitric acid, for a predetermined amount of time to remove the graphitization catalyst film.

By performing the acid treatment, the graphene laminate, which is a laminate of the graphene/binder layer/substrate (i.e., the graphene directly on the binder layer, which is directly on the substrate), is obtained. Because the graphene is transferred to the separate substrate (i.e., substrate 10), with the graphitization catalyst film thereon, which is later removed by the acid treatment, defects on the graphene may be minimized or effectively eliminated.

The graphene laminate may be used to form a flexible structure if the graphene laminate is based on a flexible substrate. Alternatively, the graphene laminate may be used to form a transparent electrode if the graphene laminate is based on a flexible substrate.

The graphene laminate as described above may be effective for use in various display devices, such as a field emission display ("FED"), a liquid crystal display ("LCD"), or an organic light emitting device ("OLED"), or various electric devices, such as a super-capacitor, a fuel cell, or a solar cell, or various nano-devices, such as a field-effect transistor ("FET"), or a memory device, a transparent electrode, a hydrogen storage device, an optical fiber, or another electric device.

The disclosed embodiments will be described in further detail with reference to the following example. The following example is for illustrative purposes only and is not intended to limit the scope of the invention.

EXAMPLE 1

Figure 3A:
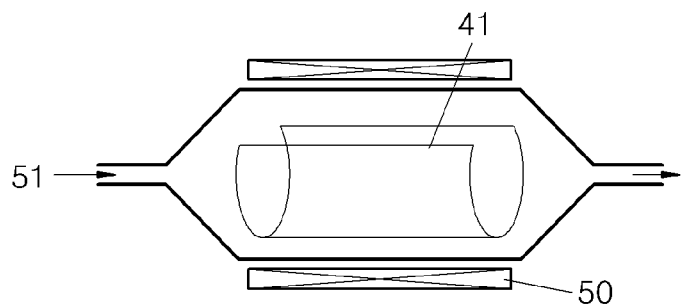
FIGS. 3A to 3E illustrates an embodiment of a method of preparing a graphene laminate.
Figure 3B:
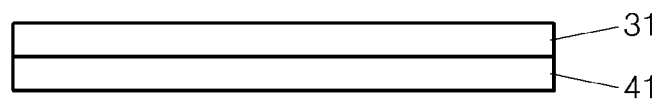

As illustrated in FIG. 3A, a graphitization catalyst film 41 comprising a copper foil (having the dimensions 50 centimeters (cm) by 70 cm) with a first surface coated with pure copper and an opposite second surface having a copper oxide film, was put into a chamber, and was then thermally treated with a halogen lamp heater 50 at about 400° C. for 20 minutes while acetylene gas (i.e., carbon source 51) was supplied into the chamber at a rate of 200 standard cubic centimeters per minute (sccm), thereby growing graphene on the copper surface of the copper foil. Then, the heat source (i.e., halogen lamp 50) was removed from the chamber to naturally cool the inner temperature of the chamber, thereby allowing the graphene to form in a predetermined orientation. As a result, seven layers of graphene 31 were formed on the copper foil (e.g., on the graphitization catalyst film 41), as illustrated in FIG. 3B.

Also, a surface of a polyethylene terephthalate ("PET") substrate 11 having the dimensions 60 cm by 80 cm was entirely coated with an ethylene vinyl acetate ("EVA") hot-melt using bar coating to manufacture an adhesive substrate for binding comprising the PET substrate 11 and an EVA layer 21.

Figure 3C:
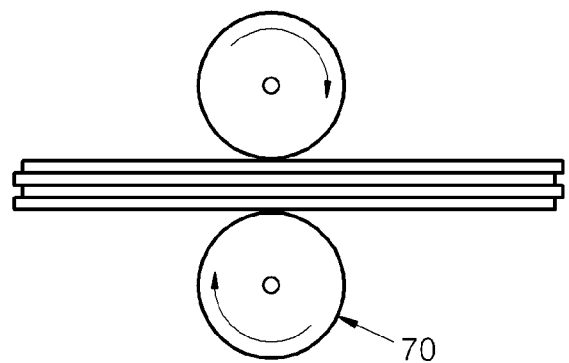

The copper foil with the graphene and the adhesive substrate were brought in contact with each other so as to contact the graphene 31 and the EVA layer 21, and then were passed between a pair of heated rollers 70 in a roll-to-roll pressing operation, as illustrated in FIG. 3C. The pair of rollers was heated to about 115° C. to melt the EVA to provide adhesive properties. Then, the heating was stopped to naturally cool and cure the EVA, thereby resulting in an EVA binder layer 22 between the graphene 31 and the PET substrate 11.

Figure 3D:
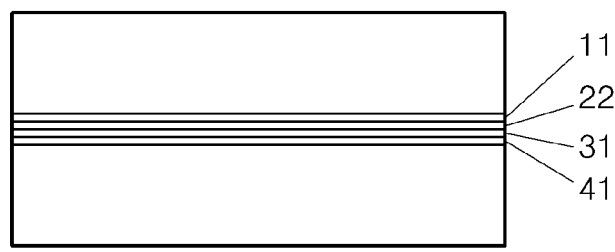

The resulting laminate of the PET substrate/EVA binder layer/graphene/graphitization catalyst film was immersed in an etchant (Nickel Etchant Type I, available from Transene company, Inc.) for 1 hour, as illustrated in FIG. 3D. The graphitization catalyst film 41 (i.e., the copper foil) was removed by the etchant from the laminate to provide a graphene laminate 1 including the PET substrate/EVA binder layer/graphene laminate.

Figure 3E:
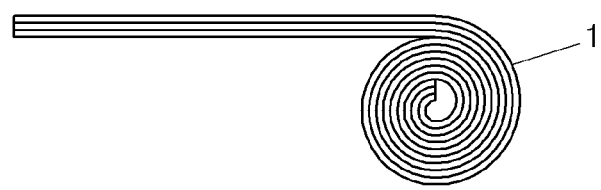

The graphene laminate 1 may be rolled up, as illustrated in FIG. 3E, for storage, for example.

As described above, according to the one or more of the above embodiments, a graphene laminate may include graphene strongly bound to a substrate. In a method of preparing the graphene laminate, graphene may be transferred from one substrate to another so as to reduce or effectively eliminate defects on the graphene. The graphene laminate may be applied in various fields.

It should be understood that the exemplary embodiments described herein should be considered in a descriptive sense only and not for purposes of limitation. Descriptions of features, advantages, or aspects within each embodiment should be considered as available for other similar features, advantages or aspects in other embodiments.

What is claimed is:

1. A graphene laminate comprising:
   a substrate;
   a binder layer on the substrate; and
   graphene on the binder layer, wherein the graphene is bound to the substrate by the binder layer, and
   wherein the graphene comprises about ten or less wrinkles per 1000 square micrometers area.

2. The graphene laminate of claim 1, wherein the binder layer is a cured resin layer formed from at least one of a room-temperature curable resin, a thermally curable resin, a hot-melt resin, or a low-pressure curable resin.

3. The graphene laminate of claim 1, wherein the binder layer comprises the reaction product of curing at least one of a room-temperature curable resin, a thermally curable resin, a hot-melt resin, or a low-pressure curable resin.

4. The graphene laminate of claim 2, wherein the room-temperature curable resin comprises at least one of a cellulose ether, a glue, a vinylacetate, a nitrocellulose, a urethane, a synthetic rubber, a cyanoacrylate, or a polyester acrylate.

5. The graphene laminate of claim 2, wherein the thermally curable resin comprises at least one of an epoxy, a melamine, a silicone, a phenol, or a resorcinol.

6. The graphene laminate of claim 2, wherein the hot-melt resin comprises at least one of a polyethylene, a vinylacetate copolymer, or a thermoplastic.

7. The graphene laminate of claim 6, wherein the thermoplastic comprises at least one of a polyurethane, a polyvinylchloride, a polystyrene, a polyamide, a polyethylene, a polyacetal, a nylon, or an acrylic.

8. The graphene laminate of claim 1, wherein the binder layer has a thickness of about 0.01 nanometers to about 1,000 nanometers.

9. The graphene laminate of claim 1, wherein the substrate comprises at least one of a silicon substrate, a glass substrate, a GaN substrate, a silica substrate, a polyethyeleneterephtalate substrate, a polyethylene napthalate substrate, a polyether sulphone substrate, a nickel substrate, a cobalt substrate, a iron substrate, a platinum substrate, a palladium substrate, a gold substrate, an aluminum substrate, a chromium substrate, a copper substrate, a manganese substrate, a molybdenum substrate, a rhodium substrate, a iridium substrate, a tantalum substrate, a titanium substrate, a tungsten substrate, a uranium substrate, a vanadium substrate, or a zirconium substrate.

10. The graphene laminate of claim 9, wherein the binder layer is a cured resin layer formed from at least one of a room-temperature curable resin, a thermally curable resin, a hot-melt resin, or a low-pressure curable resin.

11. The graphene laminate of claim 1, wherein the substrate comprises a material having a Young's modulus of about 0.01 gigaPascals to about 100 gigaPascals.

12. The graphene laminate of claim 1, wherein the graphene has an area of 1 square millimeter or greater.

13. The graphene laminate of claim 1, wherein the graphene covers an area of about 99 percent or greater per 1 square millimeter area.

14. A transparent electrode comprising the graphene laminate according to claim 1.

15. An electrical device comprising the graphene laminate according to claim 1.

16. A graphene laminate comprising:
a substrate comprising polyethylene terephthalate;
a binder layer comprising ethylene vinyl acetate directly on the substrate; and
graphene directly on the binder layer,
wherein the graphene is bound to the poylethylene terephthalate by the binder layer, and the graphene comprises 10 or less wrinkles per square millimeter of the graphene.

17. A graphene laminate comprising:
a substrate;
a binder layer on the substrate; and
graphene on the binder layer, wherein the graphene is bound to the substrate by the binder layer;
wherein the substrate comprises at least one of a silicon substrate, a glass substrate, a GaN substrate, a silica substrate, a polyethyeleneterepthalate substrate, a polyethylene napthalate substrate, or a polyether sulphone substrate;
the binder layer is a cured resin layer formed from at least one of a room-temperature curable resin, a thermally curable resin, a hot-melt resin, or a low-pressure curable resin; and
the graphene comprises about ten or less wrinkles per 1000 square micrometers area.

18. A graphene laminate comprising:
a substrate;
a binder layer on the substrate; and
graphene on the binder layer, wherein the graphene is bound to the substrate by the binder layer;
wherein the substrate comprises at least one of a silicon substrate, a glass substrate, a GaN substrate, a silica substrate, a polyethyeleneterepthalate substrate, a polyethylene napthalate substrate, a polyether sulphone substrate, a nickel substrate, a cobalt substrate, a iron substrate, a platinum substrate, a palladium substrate, a gold substrate, an aluminum substrate, a chromium substrate, a copper substrate, a manganese substrate, a molybdenum substrate, a rhodium substrate, a iridium substrate, a tantalum substrate, a titanium substrate, a tungsten substrate, a uranium substrate, a vanadium substrate, or a zirconium substrate;
the binder layer is a cured resin layer formed from a composition comprising a hot-melt resin; and
the graphene comprises about ten or less wrinkles per 1000 square micrometers area.

* * * * *